US 9,007,252 B1

(12) United States Patent
Hsu

(10) Patent No.: US 9,007,252 B1
(45) Date of Patent: Apr. 14, 2015

(54) ANALOG TO DIGITAL CONVERSION METHOD AND RELATED ANALOG TO DIGITAL CONVERTER

(71) Applicant: NOVATEK Microelectronics Corp., Hsin-Chu (TW)

(72) Inventor: Jer-Hao Hsu, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/265,338

(22) Filed: Apr. 29, 2014

(30) Foreign Application Priority Data

Oct. 17, 2013 (TW) .............................. 102137519 A

(51) Int. Cl.
*H03M 1/12* (2006.01)
*H03M 1/14* (2006.01)

(52) U.S. Cl.
CPC . *H03M 1/14* (2013.01); *H03M 1/12* (2013.01)

(58) Field of Classification Search
CPC ..... H04N 5/335; H04N 5/378; H04N 5/3658; H04N 5/37455; H03M 1/08; H03M 1/123; H03M 1/46; H03M 1/56; H03M 1/144; H03M 1/403; H03M 1/765; H03M 1/0695
USPC .................... 348/302, 241, 294, 300, E5.091; 341/130–165
See application file for complete search history.

(56) References Cited

U.S. PATENT DOCUMENTS

| | | | | |
|---|---|---|---|---|
| 5,119,097 | A * | 6/1992 | Ohkura et al. | 341/158 |
| 5,270,716 | A * | 12/1993 | Gleim | 341/145 |
| 5,801,657 | A * | 9/1998 | Fowler et al. | 341/155 |
| 6,707,403 | B1 * | 3/2004 | Hurrell | 341/120 |
| 7,230,561 | B2 * | 6/2007 | Lee | 341/172 |
| 8,159,583 | B2 * | 4/2012 | Kim et al. | 348/302 |
| 8,492,697 | B2 * | 7/2013 | Neubauer et al. | 250/208.1 |

* cited by examiner

*Primary Examiner* — Lam T Mai
(74) *Attorney, Agent, or Firm* — Winston Hsu; Scott Margo

(57) ABSTRACT

An analog to digital conversion method includes charging a capacitor through an analog signal to sample a voltage of the analog signal; coupling the capacitor and a plurality of reference voltages to a comparator when a voltage of the capacitor is equal to the voltage of the analog signal, to compare the voltage of the capacitor with the reference voltages and generate a first comparison result; coupling the capacitor to a ramp generator when a status of the first comparison result changes, to compare a ramp signal of the ramp generator with a voltage difference of a first reference voltage and the voltage of the capacitor and generate a second comparison result; obtaining a voltage of the ramp signal when a status of the second comparison result changes; and obtaining a digital code of the analog signal according to the first reference voltage and the voltage of the ramp signal.

18 Claims, 4 Drawing Sheets

ANALOG TO DIGITAL CONVERSION METHOD AND RELATED ANALOG TO DIGITAL CONVERTER

BACKGROUND OF THE INVENTION

1. Field of the Invention

The present invention relates to an analog-to-digital conversion method and a related analog to digital converter (ADC), and more particularly, to a method of utilizing multiple reference voltages and a single ramp generator to realize a two-step analog to digital conversion and a related ADC.

2. Description of the Prior Art

Speed of picture sensor becomes faster and is capable of capturing pictures of various objects more accurately (e.g. via visible light, infrared light, etc.). For example, cameras having the capability of capturing 120 pictures of 10M pixels per second become commercial goods in daily life. Similarly, sensors with ultra-high speed (10,000 pictures per second) and high accuracy are developed for biochemistry, robot and architecture, etc. In order to satisfy market demand to keep improving such images, attention should be made on system design and technology innovation, e.g. enhancement of speed and sensor quality, and simplified image sensor realized by stacking multiple integrated circuits. Besides, development of new read-out structure may realize a higher reading speed. However, such improvements require innovation of the analog to digital converters (ADC), in order to reduce area and power consumption, and enhance speed and resolution.

With the progress of integrated circuit process technology, bit numbers of a digital signal outputted by the ADC become higher. In other words, values of the digital signal are more analogous to the inputted analog signal. Of course, the increase of the bit number of the digital signal may also lead to more complexity of the circuit, layout area and noise reduction requirements in the ADC. The published patents teaching ADC and related methods are recited as follows.

United States publication number US 20120025062 discloses a mix-mode ADC, an image sensor and a method of providing a plurality of digital codes. However, a large number of capacitors are required to realize this patent and thus a larger pixel sensor should be utilized. Therefore, smaller image sensors may not be realized.

"Multiple-Ramp Column-Parallel ADC Architectures for CMOS Image Sensor" in IEEE Journal discloses an image sensor capable of processing analog to digital conversion in parallel by using a multiple-ramp single-slope ADC. One of the drawbacks of this article is that multiple ramp generators are required, to generate a power consumption problem.

European patent number EP 1351490 discloses an image sensor capable of improving a reading circuit, and U.S. Pat. No. 6,670,904 discloses a two-ramp ADC for complementary metal oxide semiconductor. However, realizations of these patents are only limited to a linear search.

SUMMARY OF THE INVENTION

It is therefore an objective of the present invention to provide an analog to digital (A/D) conversion method, in order to save power consumption and reduce conversion time.

The present invention discloses an A/D conversion method. The A/D conversion method comprises charging a capacitor through an analog signal to sample a voltage of the analog signal; coupling the capacitor and a plurality of reference voltages to a comparator when a voltage of the capacitor is equal to the voltage of the analog signal, to compare the voltage of the capacitor with the plurality of reference voltages and generate a first comparison result; coupling the capacitor to a ramp generator when a status of the first comparison result changes, to compare a ramp signal of the ramp generator with a voltage difference of a first reference voltage of the plurality of reference voltages and the voltage of the capacitor and generate a second comparison result; obtaining a first voltage of the ramp signal when a status of the second comparison result changes; and obtaining a digital code of the analog signal according to the first reference voltage and the first voltage of the ramp signal.

The present invention further discloses an analog to digital converter (ADC) for processing a plurality of analog signals in parallel. The ADC comprises a plurality of parallel processing column, for simultaneously inputting the plurality of analog signals, wherein each parallel processing column comprises: a capacitor, for sampling a voltage of the analog signal according to an analog signal of the plurality of analog signals; a first switch, coupled to a first terminal of the capacitor, for controlling a coupling of the capacitor; a second switch, coupled to a second terminal of the capacitor, for controlling the coupling of the capacitor; and a comparator, having a first input terminal coupled to the reference voltage generator, a second input terminal coupled to each of the second switch, and an output terminal for generating a first comparison result and a second comparison result. The ADC further comprises a reference voltage generator, for generating a plurality of reference voltages; and a ramp generator, coupled to the first switch, for generating a ramp signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
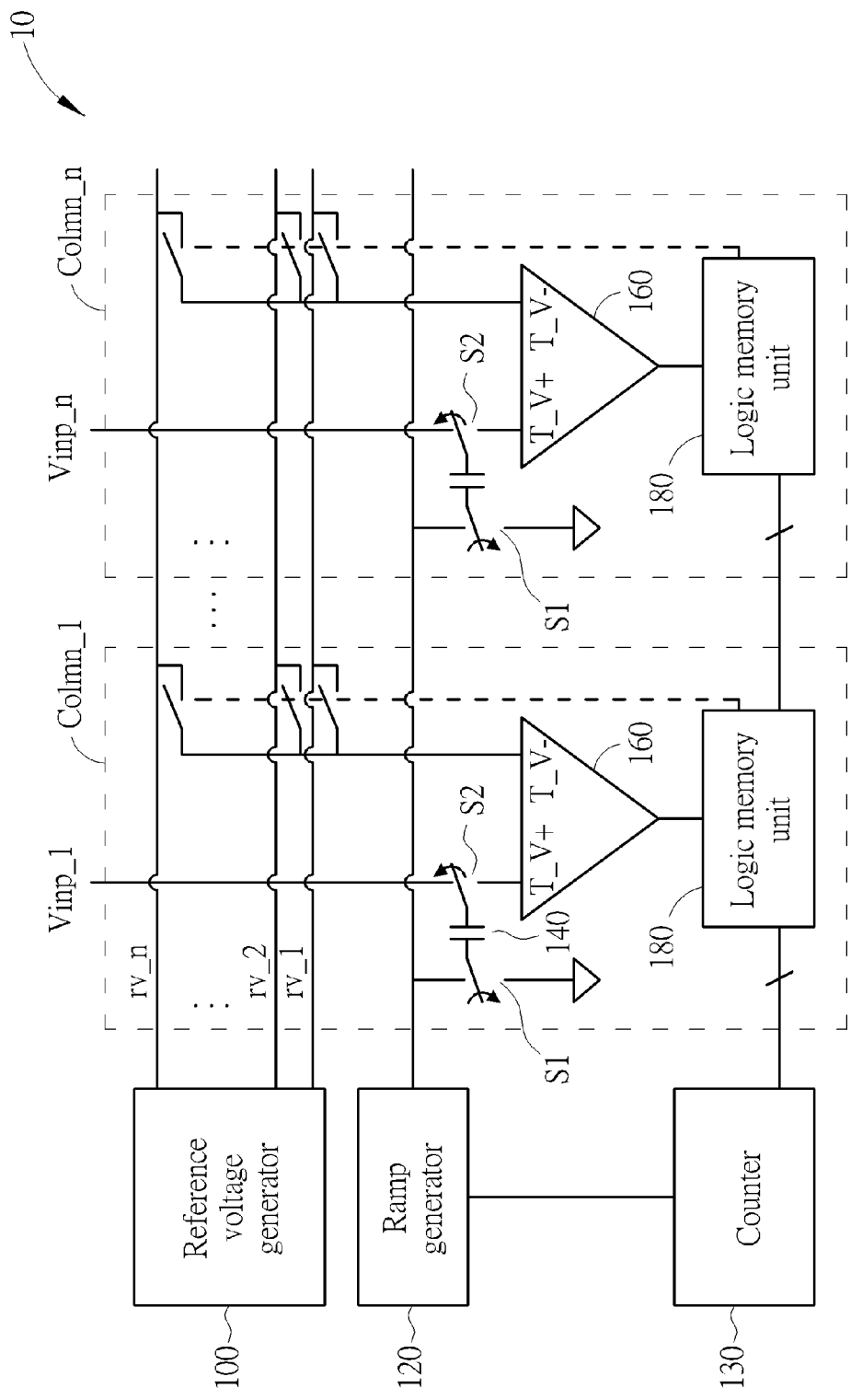
FIG. 1 is a schematic diagram of an analog to digital converter according to an embodiment of the present invention.

Please refer to FIG. 1, which is a schematic diagram of an analog to digital converter (ADC) 10 according to an embodiment of the present invention. The ADC 10 may process analog signals Vinp_1, Vinp_2, . . . , Vinp_n in parallel. The ADC 10 includes parallel processing columns colmn_1, colmn_2, . . . , colmn_n, a reference voltage generator 100, a ramp generator 120 and a counter 130. The reference voltage generator 100 is utilized for generating reference voltages rv_1, rv_2, . . . , rv_n, to perform a coarse conversion on the analog signals Vinp_1, Vinp_2, . . . , Vinp_n. The parallel processing columns colmn_1, colmn_2, . . . , colmn_n are utilized for simultaneously inputting the analog signals Vinp_1, Vinp_2, . . . , Vinp_n, and outputting corresponding digital codes in parallel. Each of the parallel processing columns colmn_1, colmn_2, . . . , colmn_n includes a capacitor 140, switches S1 and S2, a comparator 160 and a logic memory unit 180. The capacitor 140 is utilized for sampling a voltage of an analog signal of the analog signals Vinp_1, Vinp_2, . . . , Vinp_n. The switch S1, coupled to a first terminal of the capacitor 140, is utilized for controlling a coupling of the capacitor 140. The switch S2, coupled to a second terminal of the capacitor 140, is utilized for controlling the coupling of the capacitor 140. The comparator 160 has a first input terminal T_V−, a second input terminal T_V+ and an output terminal. The first input terminal T_V− is coupled to the reference voltage generator 100. The second input terminal T_V+ is coupled to the switch S2. The output terminal is utilized for generating a comparison result cmpr_1 and a comparison result cmpr_2. The ramp generator 120, coupled to the switch S1, is utilized for generating a ramp signal Rmp to perform a fine conversion on the analog signals.

For easily illustrating, only the parallel processing column colmn_1 is taken as an example. When the switch S1 is "1" and the switch S2 is "1", a terminal of the capacitor 140 is coupled to the analog signal Vinp_1 and the other terminal of the capacitor 140 is coupled to a ground terminal, so that the analog signals Vinp_1 may charge the capacitor 140. When the switch S1 is "1" and the switch S2 is "0", the capacitor 140 is coupled to the second input terminal T_V+ of the comparator 160, and the first input terminal T_V− of the comparator 160 is coupled to the reference voltage generator 100. At this moment, the voltage of the capacitor 140 is charged to the voltage of the analog signal Vinp_1, and the comparator 160 starts to compare the voltage of the capacitor 140 (i.e. the voltage of the analog signal Vinp_1) with the reference voltages rv_1, rv_2, . . . , rv_n and generates the comparison result cmpr_1. The comparator 160 may use a binary search or a linear search to compare the voltage of the capacitor 140 with the reference voltages rv_1, rv_2, . . . , rv_n. If the binary search is applied, the logic memory unit 180 may further include a successive approximate register (SAR). Preferably, the reference voltages rv_1, rv_2, . . . , rv_n may be arranged from small to large in a binary manner. If the voltage of the capacitor 140 is greater than the reference voltage, the comparison result cmpr_1 is "1". If the voltage of the capacitor 140 is smaller than the reference voltage, the comparison result cmpr_1 is "0". If a reference voltage rv_p is compared with the voltage of the capacitor 140 and the status of the comparison result changes (from "0" to "1"), the voltage of the capacitor 140 (i.e. the voltage of the analog signal Vinp_1) is between a reference voltage rv_p−1 and the reference voltage rv_p. Since the reference voltage rv_p−1 may be denoted by a digital code P, the ADC 10 obtains the digital code of the coarse conversion (i.e. more significant bits (MSBs)). The first input terminal T_V− of the comparator 160 is coupled to the reference voltage rv_p−1 to further perform the fine conversion.

When the fine conversion is performed, the switch S1 is switched to "0" and the switch S2 is switched to "0". At this moment, the capacitor 140 is coupled to the second input terminal T_V+ of the comparator 160 and the ramp generator 120, and the first input terminal T_V− of the comparator 160 is coupled to the reference voltage rv_p−1. The comparator 160 starts to compare the voltage of the first input terminal T_V− (i.e. the reference voltage rv_p−1) with the voltage of the second input terminal T_V+ (i.e. the voltage of the capacitor 140 plus the ramp signal Rmp). In other words, the comparator 160 compares the ramp signal Rmp with a voltage difference V of the reference voltage rv_p−1 and the voltage of the capacitor 140 and generates the comparison result cmpr_2. Preferably, the ramp signal Rmp has a negative slope or a positive slope. The counter 130, coupled to the ramp generator 120, is incremented by one bit each time when the ramp signal Rmp descends/ascends (according to the ramp signal Rmp has the negative slope or positive slope) a step. When the ramp signal Rmp descends/ascends to a voltage value V' (slightly smaller than the voltage difference V of the reference voltage rv_p−1 and the voltage of the capacitor 140), the status of the comparison result cmpr_2 may change. For example, the voltage of the capacitor is 0.35V and the reference voltage rv_p−1 is 0.30V. The comparator 160 compares the reference voltage rv_p−1 (0.30V) with the sum of the voltage of the capacitor 140 (0.35V) and the ramp signal Rmp. Since the ramp signal Rmp has a negative slope, the voltage of the second input terminal T_V+ of the comparator 160 may decrease from 0.35V. When the voltage of the second input terminal T_V+ of the comparator 160 decreases from 0.35V to slightly smaller than the reference voltage rv_p−1 (0.30V), the status of the comparison result cmpr_2 changes.

When the status of the comparison result cmpr_2 changes, the counter 130 outputs a digital code Q to the logic memory unit 180 where the digital code Q is generated when the ramp signal Rmp has the voltage V'. As a result, the ADC 10 obtains the digital code of the fine conversion (i.e. other less significant bits (LSBs)). The ADC 10 may obtain a digital code N of the analog signal Vinp_1 according to the digital code P of the reference voltage rv_p−1 and the voltage V' (i.e. the MSBs) and the digital code Q (i.e. other LSBs), wherein N=P+Q. The ADC 10 requires conversion time 2P+2Q. In the prior art, the same ADC with N bits may require conversion time 2N. In comparison, the ADC 10 of the present invention can save the conversion time. In addition, a final digital code may be obtained by performing mathematical operation on the MSBs and the LSBs.

In brief, the ADC 10 utilizes the switches S1 and S2 to couple the two input terminals of the comparator 160 to the reference voltage generator 100, the ramp generator 120 or the capacitor 140, to perform coarse conversion and fine conversion on the analog signals Vinp_1, Vinp_2, . . . , Vinp_n in parallel. For the coarse conversion, the ADC 10 may flexibly use the binary search or the linear search. Besides, the ADC in the embodiment of the present invention only needs one ramp generator, which not only saves the conversion time but also solves the power consumption problem in the prior art.

Figure 2:
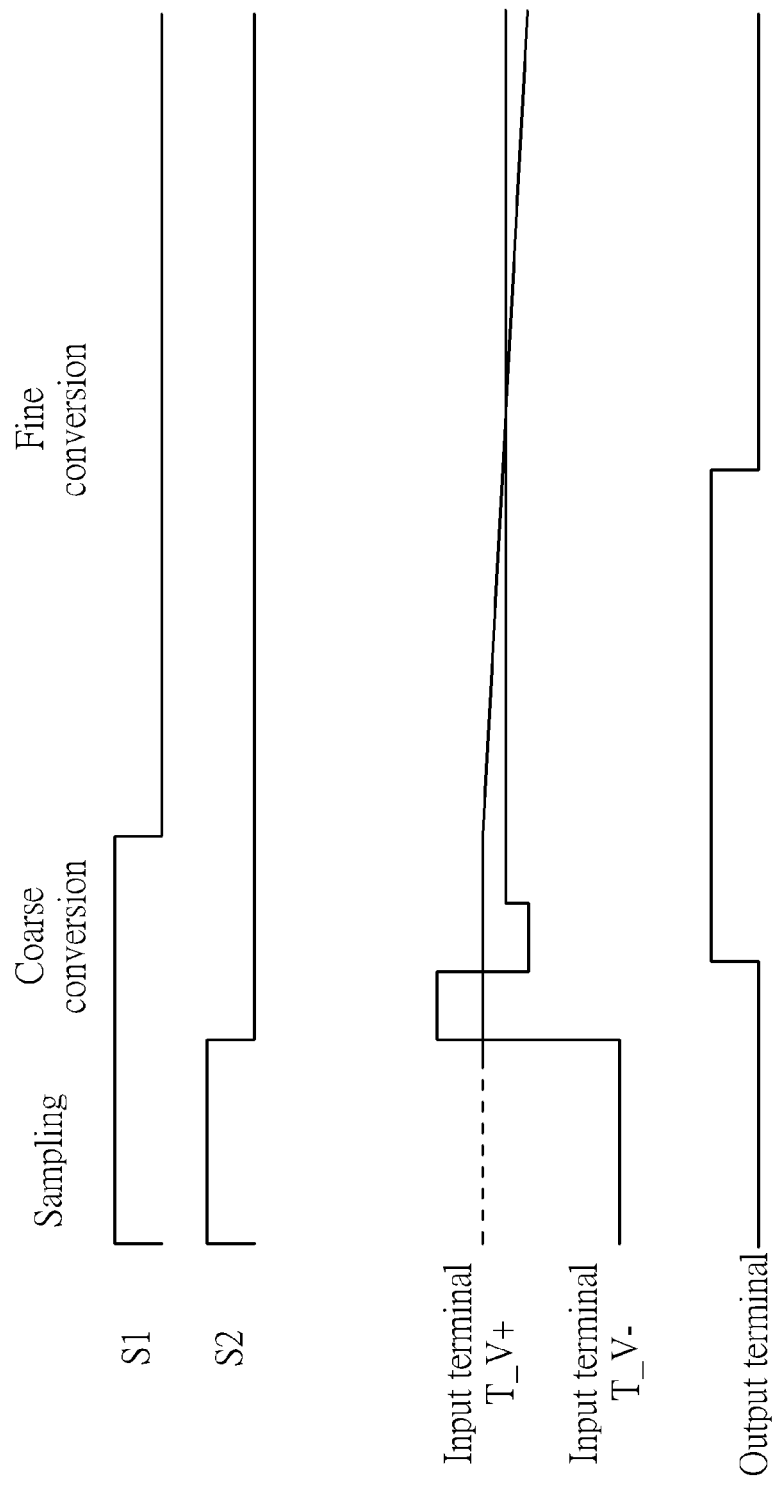
FIG. 2 is a timing diagram of the analog to digital converter shown in FIG. 1.

Please refer to FIG. 2, which is a timing diagram of the ADC 10. FIG. 2 includes voltage signals of the switches S1 and S2, a voltage signal of the first output terminal T_V− of the comparator 160, a voltage signal of the second output terminal T_V+ of the comparator 160 and a voltage signal of the output terminal of the comparator 160. Variations in the output terminal of the comparator 160 are shown in FIG. 2.

Figure 3:
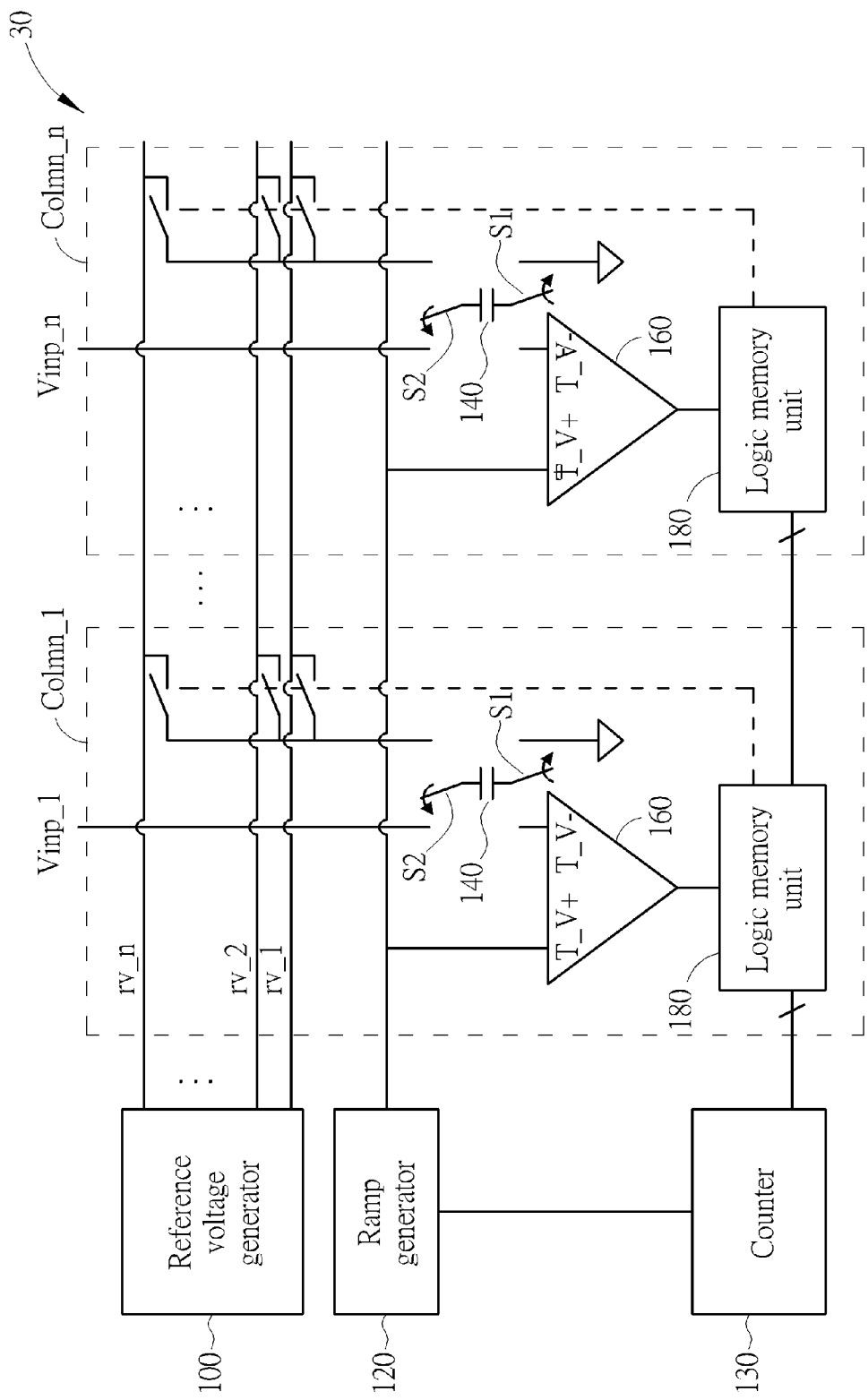
FIG. 3 is a schematic diagram of another analog to digital converter according to an embodiment of the present invention.
Figure 4:
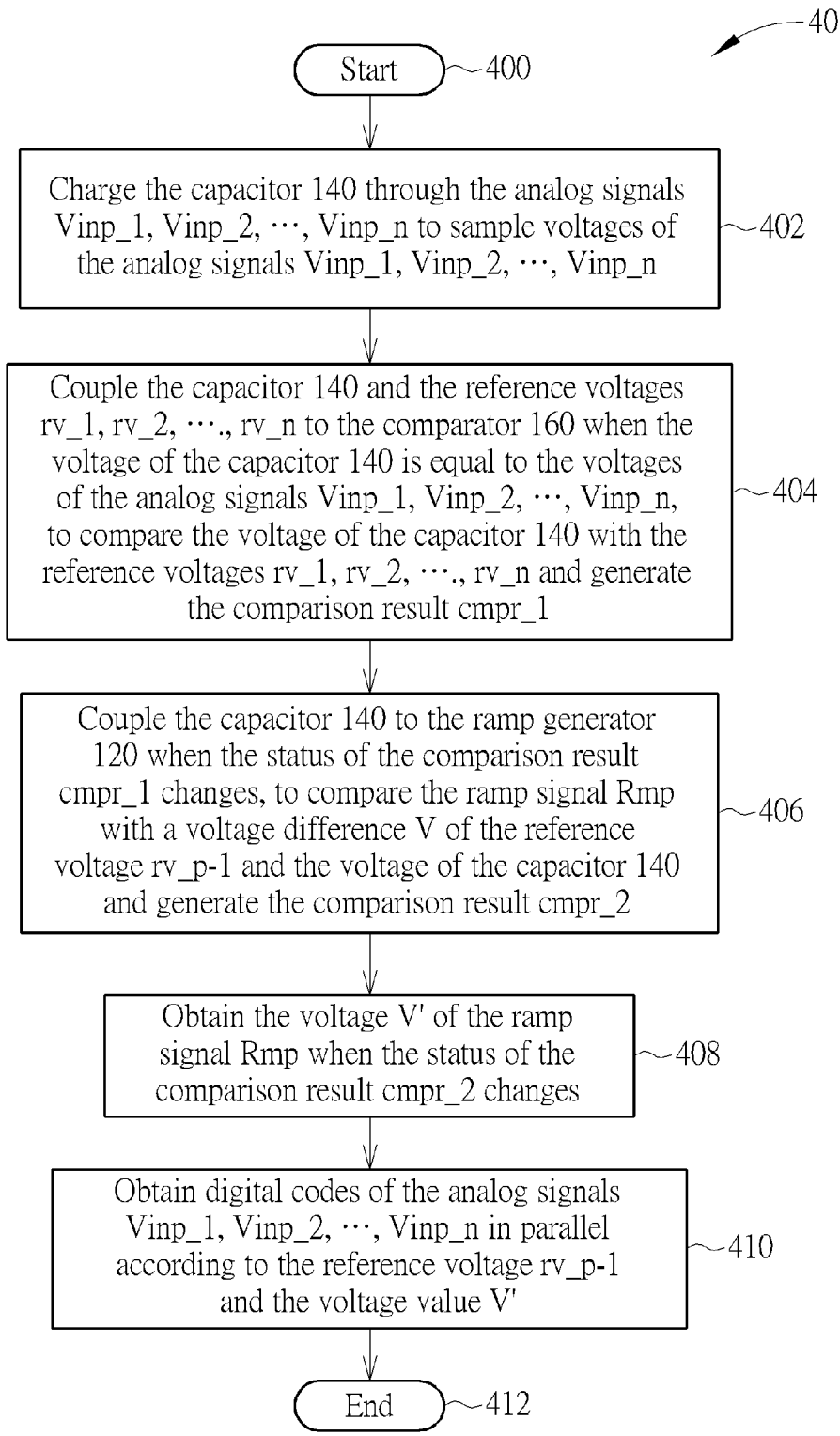
FIG. 4 is a schematic diagram of a process according to an embodiment of the present invention.

Please refer to FIG. 3, which is a schematic diagram of another ADC 30 according to an embodiment of the present invention. The basic structure of the ADC 30 is similar to that of the ADC 10; hence the same elements and signals are denoted by the same symbols. The difference between the ADC 30 and the ADC 10 is only in the coupling location of the capacitor 140 and the switches S1 and S2. When the switch S1 is switched to "0" and the switch S2 is switched to "0", the capacitor 140 is coupled to the first input terminal T_V− of the comparator 160 and the reference voltage rv_p−1, and the second input terminal T_V+ of the comparator 160 is coupled to the ramp generator 120. The comparator 160 compares the ramp signal Rmp with the voltage difference V of the reference voltage rv_p−1 and the voltage of the capacitor 140, and generates the comparison result cmpr_2. Other operations are illustrated above, and will not be narrated herein.

The operation related to the ADC 10 can be summarized into a process 40. The process 40 is utilized in the ADC 10 for converting an analog signal to a digital code. The process 40 includes the following steps:

Step 400: Start.

Step 402: Charge the capacitor 140 through the analog signals Vinp_1, Vinp_2, ..., Vinp_n to sample voltages of the analog signals Vinp_1, Vinp_2, ..., Vinp_n.

Step 404: Couple the capacitor 140 and the reference voltages rv_1, rv_2, ..., rv_n to the comparator 160 when the voltage of the capacitor 140 is equal to the voltages of the analog signals Vinp_1, Vinp_2, ..., Vinp_n, to compare the voltage of the capacitor 140 with the reference voltages rv_1, rv_2, ..., rv_n and generate the comparison result cmpr_1.

Step 406: Couple the capacitor 140 to the ramp generator 120 when the status of the comparison result cmpr_1 changes, to compare the ramp signal Rmp with a voltage difference V of the reference voltage rv_p−1 and the voltage of the capacitor 140 and generate the comparison result cmpr_2.

Step 408: Obtain the voltage V' of the ramp signal Rmp when the status of the comparison result cmpr_2 changes.

Step 410: Obtain digital codes of the analog signals Vinp_1, Vinp_2, ..., Vinp_n in parallel according to the reference voltage rv_p−1 and the voltage value V'.

Step 412: End.

Detailed implementations of the process 40 are illustrated above, and will not be narrated herein.

To sum up, the ADC in the embodiment of the present invention utilizes switches to couple the two input terminals of the comparator to the reference voltage generator, the ramp generator or the capacitor, in order to perform coarse conversion and fine conversion on the analog signals in parallel; hence, the conversion time of the ADC may be saved. Besides, the ADC in the embodiment of the present invention only needs one ramp generator, which may also solve the power consumption problem in the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog to digital (A/D) conversion method, comprising:
charging a capacitor through an analog signal to sample a voltage of the analog signal;
coupling the capacitor and a plurality of reference voltages to a comparator when a voltage of the capacitor is equal to the voltage of the analog signal, to compare the voltage of the capacitor with the plurality of reference voltages and generate a first comparison result;
coupling the capacitor to a ramp generator when a status of the first comparison result changes, to compare a ramp signal of the ramp generator with a voltage difference of a first reference voltage of the plurality of reference voltages and the voltage of the capacitor and generate a second comparison result;
obtaining a first voltage of the ramp signal when a status of the second comparison result changes; and
obtaining a digital code of the analog signal according to the first reference voltage and the first voltage of the ramp signal.

2. The A/D conversion method of claim 1, wherein comparing the voltage of the capacitor with the plurality of reference voltages is performed via a binary search or a linear search.

3. The A/D conversion method of claim 1, wherein the status of the first comparison result changes when the voltage of the capacitor is compared with a second reference voltage of the plurality of reference voltages.

4. The A/D conversion method of claim 3, wherein the analog signal is between the first reference voltage and the second reference voltage.

5. The A/D conversion method of claim 3, wherein more significant bits (MSBs) of the digital code are obtained from the first reference voltage, and less significant bits (LSBs) of the digital code are obtained from the first voltage of the ramp signal.

6. The A/D conversion method of claim 1, wherein the ramp signal has a positive or negative slope.

7. The A/D conversion method of claim 6, wherein a counter is incremented by one bit each time when the ramp signal descends or ascends a step.

8. An analog to digital converter (ADC), for processing a plurality of analog signals in parallel, the ADC comprising:
a plurality of parallel processing columns, for simultaneously inputting the plurality of analog signals, each parallel processing column comprising:
a capacitor, for sampling a voltage of the analog signal according to an analog signal of the plurality of analog signals;
a first switch, coupled to a first terminal of the capacitor, for controlling a coupling of the capacitor;
a second switch, coupled to a second terminal of the capacitor, for controlling the coupling of the capacitor; and
a comparator, having a first input terminal coupled to the reference voltage generator, a second input terminal coupled to the second switch of each parallel processing column, and an output terminal for generating a first comparison result and a second comparison result;
a reference voltage generator, for generating a plurality of reference voltages; and
a ramp generator, coupled to the first switch, for generating a ramp signal.

9. The ADC of claim 8, wherein the comparator compares the voltage of the capacitor with the plurality of reference voltages and generates the first comparison result when the second switch couples the capacitor to the comparator.

10. The ADC of claim 9, wherein the comparator uses a binary search or a linear search to compare the voltage of the capacitor with the plurality of reference voltages.

11. The ADC of claim 9, wherein the first switch couples the ramp generator to the comparator when a status of the first comparison result changes, and the comparator compares the ramp signal with a voltage difference of a first reference voltage of the plurality of reference voltages and the voltage of the capacitor and generates the second comparison result.

12. The ADC of claim 11, wherein the status of the first comparison result changes when the voltage of the capacitor is compared with a second reference voltage of the plurality of reference voltages.

13. The ADC of claim 12, wherein the analog signal is between the first reference voltage and the second reference voltage.

14. The ADC of claim 8, further comprising a logic memory unit, for obtaining a digital code of the analog signal according to the first reference voltage and the first voltage of the ramp signal.

15. The ADC of claim 14, wherein more significant bits (MSBs) of the digital code are obtained from the first reference voltage and less significant bits (LSBs) of the digital code are obtained from the first voltage of the ramp signal.

16. The ADC of claim 8, wherein the ramp signal has a positive or negative slope.

17. The ADC of claim 16, further comprising a counter, coupled to the ramp generator, for being incremented by one bit each time when the ramp signal descends or ascends a step.

18. The ADC of claim 15, wherein a final digital code is obtained by performing a mathematical operation on the MSBs and the LSBs.

* * * * *